US008216879B2

(12) United States Patent
Kaji et al.

(10) Patent No.: US 8,216,879 B2
(45) Date of Patent: Jul. 10, 2012

(54) METHOD FOR MANUFACTURING SEMICONDUCTOR DEVICE OR APPARATUS, AND APPARATUS FOR MANUFACTURING THE SAME

(75) Inventors: Nobuyuki Kaji, Kawasaki (JP); Masato Ofuji, Honjo (JP); Yasuyoshi Takai, Kawasaki (JP); Takehiko Kawasaki, Kamakura (JP); Norio Kaneko, Atsugi (JP); Ryo Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/992,070

(22) PCT Filed: May 7, 2009

(86) PCT No.: PCT/JP2009/058950
§ 371 (c)(1),
(2), (4) Date: Nov. 10, 2010

(87) PCT Pub. No.: WO2009/139428
PCT Pub. Date: Nov. 19, 2009

(65) Prior Publication Data
US 2011/0065216 A1    Mar. 17, 2011

(30) Foreign Application Priority Data
May 12, 2008    (JP) ................................. 2008-124857

(51) Int. Cl.
*H01L 21/00*    (2006.01)
*H01L 21/16*    (2006.01)
*H01L 21/66*    (2006.01)
*G01R 31/26*    (2006.01)

(52) U.S. Cl. ........ 438/104; 438/14; 438/16; 257/E21.53
(58) Field of Classification Search .................. None
See application file for complete search history.

(56) References Cited

U.S. PATENT DOCUMENTS

| 5,012,314 A | 4/1991 | Tobita et al. | |
| 2009/0269880 A1* | 10/2009 | Itagaki et al. | ............... 438/104 |

FOREIGN PATENT DOCUMENTS

| EP | 272506 A | 6/1988 |
| JP | S62-147773 A | 7/1987 |
| JP | H10-144621 A | 5/1998 |

(Continued)

OTHER PUBLICATIONS

Nomura et al, Room-temperature fabrication of transparent flexible thin-film transistors using amorphous oxide semiconductors, Nov. 2004, Nature, vol. 432, 25, 488-492.*

(Continued)

*Primary Examiner* — Ha Tran T Nguyen
*Assistant Examiner* — Valerie N Brown
(74) *Attorney, Agent, or Firm* — Canon U.S.A., Inc. IP Division

(57) ABSTRACT

A method for manufacturing a semiconductor device or apparatus having at least a semiconductor as a component, characterized by including irradiating the semiconductor with light having a longer wavelength than the absorption edge wavelength of the semiconductor to change the threshold voltage of the semiconductor device or apparatus, and checking the threshold voltage of the semiconductor device or apparatus, after or during irradiation with the light, to determine whether the threshold voltage is in a predetermined range, during manufacturing the semiconductor device or apparatus.

22 Claims, 5 Drawing Sheets

FOREIGN PATENT DOCUMENTS

| | | |
|---|---|---|
| JP | H11-204606 A | 7/1999 |
| JP | 2000-277579 A | 10/2000 |
| JP | 2002-134754 A | 5/2002 |
| JP | 2003-294579 A | 10/2003 |

OTHER PUBLICATIONS

Barquinha et al., J. Non-Cryst. Sol., Amsterdam, NL, vol. 352, No. 1756 (2006), XP025187662.

Yabuta et al., Appl. Phys. Lett., 89, 112123 (2006).

T. Riedl, et al, Phys. Stat. Sol., 1, 175 (2007).

Kim et al., International Electron Device Meeting 2006 (IEDM'06), 11-13, 1 (2006).

P. Gorrn, et al., XP002528977, Applied Physics Letters 91, 193504 (2007).

P. Barquinha, et al, XP024904822, Superlattices and Microstructures, Academic Press, London, GB, vol. 39, No. 104 (Jan. 1, 2006).

International Preliminary Report on Patentability.

* cited by examiner

METHOD FOR MANUFACTURING SEMICONDUCTOR DEVICE OR APPARATUS, AND APPARATUS FOR MANUFACTURING THE SAME

TECHNICAL FIELD

The present invention relates to a method for manufacturing a semiconductor device or a semiconductor apparatus, and an apparatus for manufacturing the same.

BACKGROUND ART

Thin film transistors (TFTs) are widely used as the pixel portions of displays, such as liquid crystal displays and organic EL displays, and the switching devices of drive circuit portions. Currently, aiming at higher TFT performance, lower temperature fabrication process, and lower cost, channel layer materials are searched for and examined among broad types of materials. Such channel layer materials include, for example, amorphous silicon (a-Si), polycrystalline silicon (poly-Si), microcrystalline silicon (μc-Si), and organic semiconductors.

In recent years, amorphous oxide semiconductors have been studied as promising channel layer materials. For example, methods for fabricating TFTs using an amorphous In—Zn—O (described as a-IZO) thin film and an amorphous In—Ga—Zn—O (described as a-IGZO) thin film for the channel layer are disclosed in Barquinha et al., J. Non-Cryst. Sol., 352, 1756 (2006), and Yabuta et al., Appl. Phys. Lett., 89, 112123 (2006). TFTs using a-IZO and a-IGZO for the channel layer can be operated at high speed with field-effect mobility ten times or more the field-effect mobility of TFTs using a-Si for the channel layer, though the TFTs using a-IZO and a-IGZO for the channel layer are fabricated at lower temperature.

DISCLOSURE OF THE INVENTION

A TFT has different threshold voltage depending on the semiconductor material of the channel layer, and the fabrication method, and the threshold voltage of the TFT changes due to various causes, such as a manufacturing process history, a change over time, electrical stress, and thermal stress. Here, electrical stress is caused by the application of one of voltage and current to the semiconductor. Also, thermal stress is caused by external heating, and Joule heat due to the energization of the semiconductor itself.

The above factors may be simultaneously applied to an actual TFT. This also applies to the above oxide semiconductor TFTs, and changes in threshold voltage due to electrical stress, and a combination of electrical stress and thermal stress are observed. Examples are disclosed in Riedl et al, Phys. Stat. Sol., 1, 175 (2007), and Kim et al., International Electron Device Meeting 2006 (IEDM'06), 11-13, 1 (2006). For oxide semiconductor TFTs, a change in threshold voltage due to irradiation with visible light and ultraviolet light is also disclosed in Barquinha et al., J. Non-Cryst. Sol., 352, 1756 (2006).

However, none of the above documents clarifies a method for compensating for or suppressing the above-described change in threshold voltage, nor a method for making the effect of the change in threshold voltage relatively small.

Also, in displays, such as liquid crystal panels and organic EL panels, a change in threshold voltage during the operation of the apparatus may lead to image distortion. Therefore, an extra circuit for compensating for the change in threshold voltage is necessary, and circuits are complex, so that the problems of decreased yield and high cost also occur.

In view of the above problems, it is an object of the present invention to provide a method in which, in the manufacture of a semiconductor device or apparatus, the change in threshold voltage is compensated for with light, and whether the semiconductor device or apparatus is good or not is determined to improve the yield of the finished product and reduce manufacturing cost.

The present invention is a method for manufacturing a semiconductor device or apparatus having at least a semiconductor as a component, characterized by including irradiating the semiconductor with light having a longer wavelength than the absorption edge wavelength of the semiconductor to change the threshold voltage of the semiconductor device or apparatus, and checking the threshold voltage of the semiconductor device or apparatus, after or during irradiation with the light, to determine whether the threshold voltage is in a predetermined range, during manufacturing the semiconductor device or apparatus.

Also, the present invention is an apparatus for manufacturing a semiconductor device or apparatus having at least a semiconductor as a component, characterized by including an check chamber for determining the semiconductor device or apparatus by the method, in a manufacturing line for the semiconductor device or apparatus, the check chamber including at least a light source for irradiating the semiconductor with light having a longer wavelength than the absorption edge wavelength of the semiconductor, and a mechanism for checking the threshold voltage of the semiconductor device or apparatus after or during irradiation with the light.

According to the present invention, by irradiating the semiconductor device or apparatus with light to inspect the semiconductor device and the semiconductor apparatus and determine whether the semiconductor device and the semiconductor apparatus are good or not, during the manufacturing process, the yield of the finished product can be improved. Further, the manufacturing cost can be reduced.

Further features of the present invention will become apparent from the following description of exemplary embodiments with reference to the attached drawings.

BEST MODES FOR CARRYING OUT THE INVENTION

First, the inventors have found that by irradiating a semiconductor device or apparatus including a semiconductor as a component with light having a longer wavelength than the absorption edge wavelength of the semiconductor, only the threshold voltage of the semiconductor device or apparatus changes. Also, the inventors have found that by adjusting the intensity, time, and wavelength of light, the threshold voltage can be a target value. Therefore, in a product including a semiconductor device and a semiconductor apparatus made by the manufacturing method of the present invention applying these properties, the change in the threshold voltage of the semiconductor device due to causes, such as electrical stress and thermal stress, is compensated for by light irradiation, so that the complex circuit for compensation is unnecessary.

However, there are also cases where due to variations in the characteristics of the semiconductor material in manufacture, the threshold voltage cannot be a target value even if the semiconductor is irradiated with light. Also, without actual light irradiation, whether the threshold voltage is a target value cannot be checked. When the threshold voltage is evaluated, after the product is finished, to separate a good product and a defective product, the manufacturing cost is high. Therefore, in the present invention, the semiconductor device can be evaluated and determined during the manufacturing process. The present invention is characterized by including, during the manufacture of a semiconductor device or apparatus, irradiating the semiconductor used with light having a longer wavelength than the absorption edge wavelength of the semiconductor, and determining whether the semiconductor device or apparatus is acceptable or not, after or during irradiation with the light. The determination whether the semiconductor device or apparatus is acceptable or not can be performed by, for example, checking the threshold voltage of the semiconductor device or apparatus.

An embodiment of the method for manufacturing a semiconductor device and a semiconductor apparatus according to the present invention as described above is described using the fabrication of an organic EL display device as an example. Here, the organic EL device is used as an example, but the semiconductor device in the present invention is not limited to semiconductor devices used for organic EL display devices. In addition, the semiconductor apparatuses include displays, for example, liquid crystal displays, and electronic paper.

Figure 1:
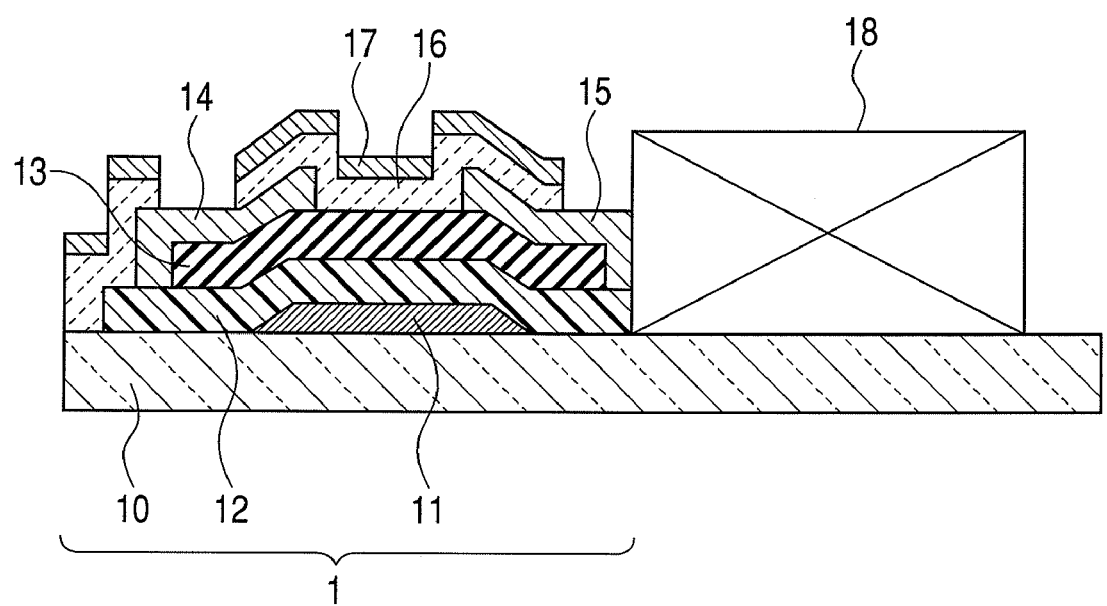
FIG. 1 is a cross-sectional view of an organic EL device, which is one example of a product manufactured according to the manufacturing method of the present invention.

First, the configuration of the semiconductor device fabricated is described. FIG. 1 illustrates a cross-sectional view of one example of an organic EL display device fabricated. As illustrated in FIG. 1, description is given here using an inverted staggered type (bottom gate type) TFT as an example, but a staggered type (top gate type) TFT may be used. A substrate is denoted by numeral 10, a gate electrode is denoted by numeral 11, a gate insulating layer is denoted by numeral 12, a channel layer is denoted by numeral 13, a source electrode is denoted by numeral 14, a drain electrode is denoted by numeral 15, a first protection layer is denoted by numeral 16, a second protection layer is denoted by numeral 17, and an organic EL portion is denoted by numeral 18. As the substrate 10, a glass substrate can be used. In this embodiment, a glass substrate, Corning 1737, manufactured by Corning is used as the substrate. Other than glass substrates, substrates of resins, such as PET resins, polycarbonate resins, and acrylic resins, can also be used.

Figure 2:
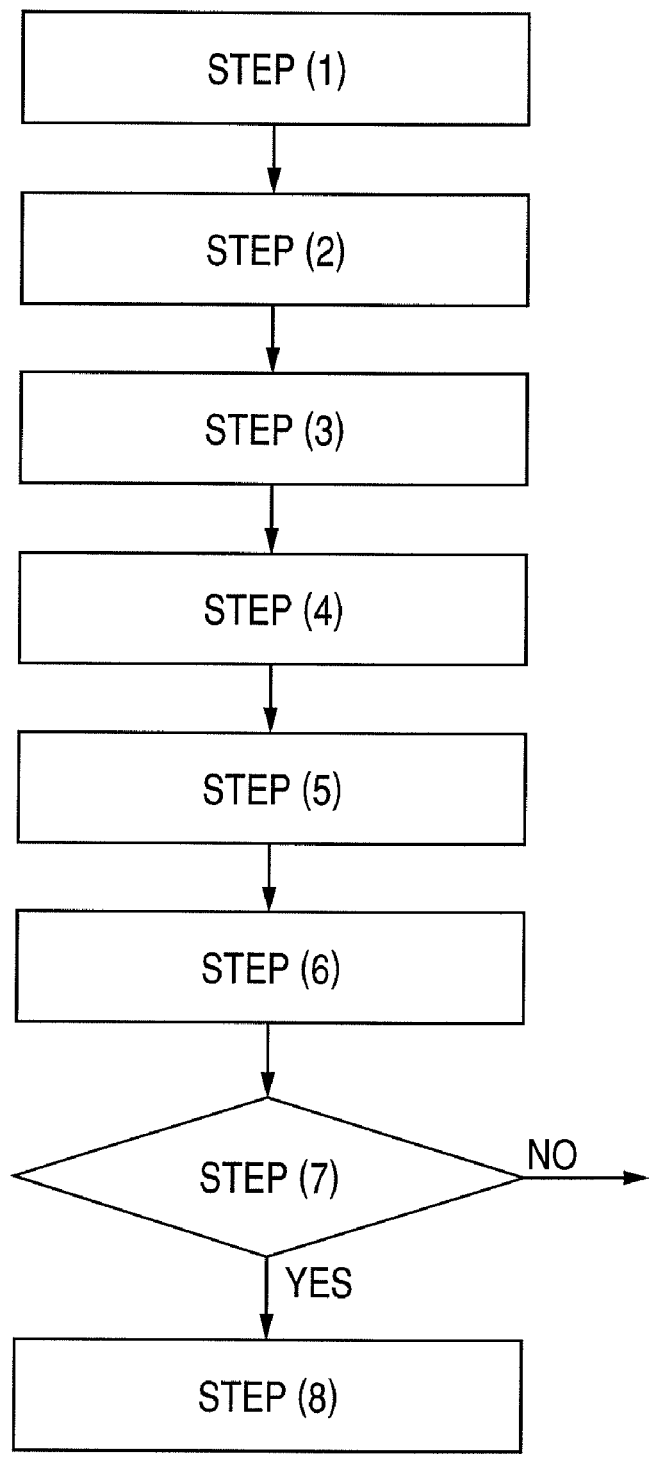
FIG. 2 is a flow chart when the manufacturing method of the present invention is applied to the manufacture of the organic EL device.

Next, using FIG. 2, one example of the process of manufacturing a semiconductor device and a semiconductor apparatus according to the present invention is described in detail, using the process of manufacturing the organic EL display device in FIG. 1 as an example.

<Step (1)>: The gate electrode 11 is formed on the glass substrate.

As the gate electrode 11, films of metals, such as Au, Pt, Al, Ni, and Ti, and oxides, such as ITO and $RuO_2$, can be used. As the film formation method for the gate electrode 11, gas phase methods, such as a sputtering method, a pulse laser vapor deposition method, and an electron beam vapor deposition method, should be used. However, the film formation method is not limited to these methods.

<Step (2)>: The gate insulating layer 12 is formed on the gate electrode.

As the gate insulating layer 12, $SiO_2$ is desirably used. Alternatively, a material including at least one of $SiO_2$, $Y_2O_3$, $Al_2O_3$, $HfO_2$, $TiO_2$, and SiN can also be used. Also, in addition to these materials, silicon oxynitride ($SiO_xN_y$) may be used. As the film formation method for the gate insulating layer 12, gas phase methods, such as a sputtering method, a pulse laser vapor deposition method, and an electron beam vapor deposition method, should be used. However, the film formation method is not limited to these methods.

<Step (3)>: The channel layer 13 is formed on the gate insulating layer.

The channel layer 13 is an amorphous oxide containing at least one of In, Ga, Zn, and Sn. As the film formation method for the channel layer 13, gas phase methods, such as a sputtering method, a pulse laser vapor deposition method, and an electron beam vapor deposition method, should be used. However, the film formation method is not limited to these methods.

<Step (4)>: The source electrode 14 and the drain electrode 15 are formed on the channel layer.

As source electrode 14 and the drain electrode 15, films of metals, such as Au, Pt, Al, Ni, and Ti, and oxides, such as ITO and $RuO_2$, can be used. As the film formation method for the source electrode 14 and the drain electrode 15, gas phase methods, such as a sputtering method, a pulse laser vapor deposition method, and an electron beam vapor deposition method, should be used. However, the film formation method is not limited to these methods.

<Step (5)>: The first protection layer 16 and the second protection layer 17 are formed on the source and drain electrodes.

As the first protection layer 16, a film of a metal oxide including at least one metal element is used. Among metal oxides, a metal oxide including at least one of the following can be used as the protection layer.

$SiO_2$, $Al_2O_3$, $Ga_2O_3$, $In_2O_3$, MgO, CaO, SrO, BaO, ZnO, $Nb_2O_5$, $Ta_2O_5$, $TiO_2$, $ZrO_2$, $HfO_2$, $CeO_2$, $Li_2O$, $Na_2O$, $K_2O$, $Rb_2O$, $Sc_2O_3$, $Y_2O_3$, $La_2O_3$, $Nd_2$, $Sm_2O_3$, $Gd_2O_3$, $Dy_2O_3$, $Er_2O_3$, and $Yb_2O_3$.

Also, in addition to the above, silicon oxynitride ($SiO_xN_y$) may be used.

As the method for forming one of the above metal oxide and $SiO_xN_y$ on the TFT as the protection layer, a sputtering method is used. Film formation is performed in an oxygen containing atmosphere during sputtering because the device in which the protection layer is formed in, for example, a pure Ar gas atmosphere has worse TFT characteristics than the device before the protection layer is formed. It is considered that the cause of worse TFT characteristics is that during the formation of the protection layer, oxygen is eliminated from the interface of the channel layer, so that carriers are produced, and the resistance of the channel layer decreases. Therefore, it is required that film formation is performed in an oxygen containing atmosphere during the sputtering of the protection layer. The oxygen content is desirably 10 to 80% of the entire sputtering gas, and can be 30 to 60%.

As the second protection layer 17, $SiN_x$ is used. As the film formation method for the second protection layer 17, gas phase methods, such as a CVD method, a sputtering method, a pulse laser vapor deposition method, and an electron beam vapor deposition method, should be used.

<Step (6)>: After or during irradiation with predetermined light, the transfer characteristics of the TFT are measured to obtain a threshold voltage Vth. Here, the threshold voltage Vth is a turn-on voltage (a gate voltage Vg when a current Id flowing between the source and the drain is more than $10^{-10}$ A).

In the above step (6), the wavelength of the predetermined light for irradiation should be a longer wavelength than the absorption edge wavelength of the semiconductor (the wavelength of the lowest energy in light absorption based on the interband transition of free carriers in the semiconductor). The reason will be described below, using a specific example of the manufacture of a TFT having an a-IGZO film as a channel layer.

First, an a-IGZO film having an absorption edge wavelength of 354 nm is formed on an $n^+$-silicon wafer substrate with a thermally oxidized silicon film (film thickness: 100 nm) by a sputtering method, and patterned by etching. Then, the whole is heated in an air atmosphere at 300° C. for 20 minutes. Further, Ti having a thickness of 5 nm and Au having a thickness of 50 nm are laminated by an electron beam vapor deposition method, and a patterned source electrode and drain electrode are formed by lift-off.

Figure 3:
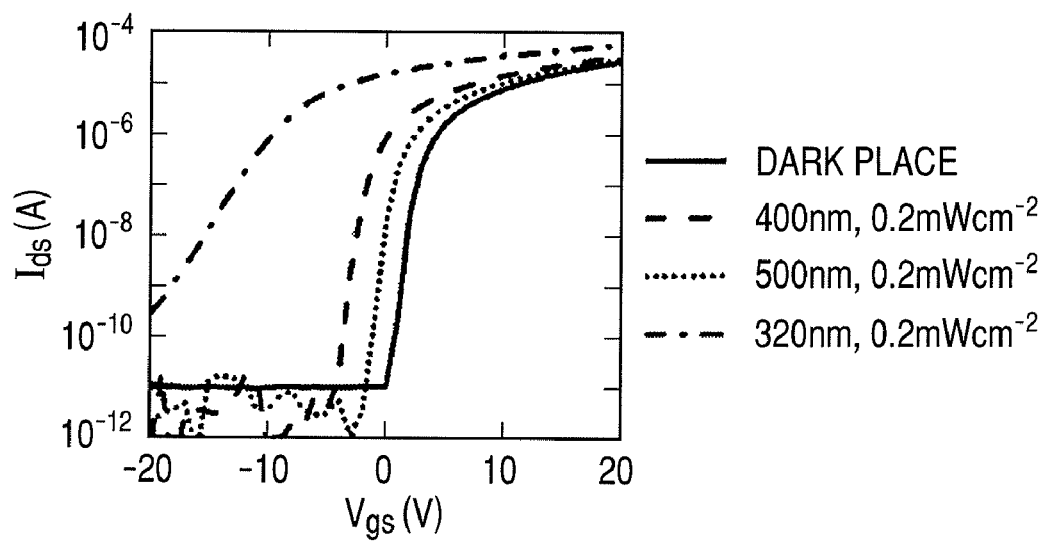
FIG. 3 is a graph illustrating the transfer characteristics of a TFT.

FIG. 3 illustrates the results of measuring the transfer characteristics of the TFT fabricated as described above, in a dark place and while irradiating with monochromatic light having a wavelength of 400 nm, 500 nm, and 320 nm each at an intensity of 0.2 mW·cm$^{-2}$ for 100 seconds. As seen from FIG. 3, when irradiation with light having a wavelength equal to or less than the absorption edge wavelength of the semiconductor (354 nm) is performed, the threshold voltage Vth changes largely. It is considered that such a change in threshold voltage due to light irradiation occurs because, for example, the fixed charge of carriers and the like trapped inside or near the semiconductor is released. According to the knowledge of the inventors, in the above semiconductor, also with light having a wavelength equal to or more than the absorption edge wavelength, 354 nm, the amount of change in the threshold voltage Vth is different depending on the wavelength of light. When irradiation with light having a wavelength twice the absorption edge wavelength is performed, the threshold voltage Vth decreases to the extent that the change in the threshold voltage Vth does not affect the characteristics. Therefore, the favorable range of light for irradiating the above semiconductor (layer) in the present invention is equal to or more than the absorption edge wavelength of the semiconductor (layer) and is twice or less the absorption edge wavelength.

Also after the light irradiation is stopped, the threshold voltage of the semiconductor may have a value different from the value before irradiation. It is considered that the threshold voltage remains changed in this manner also after light irradiation is stopped because, for example, carriers trapped inside and near the semiconductor are relocated by light excitation, and an equilibrium state different from an equilibrium state before light irradiation is reached. The present invention can also use this phenomenon.

Also, the intensity of the predetermined light for irradiation is 1 mW/cm$^2$. The light intensity is not particularly limited as long as the light intensity is in a range that the effect of the present invention (threshold compensation effect) is obtained. However, if the light intensity is too small, the effect of the present invention is small, so that the light intensity should be 0.01 mW/cm$^2$ or more. Also when the light intensity is 1 mW/cm$^2$ or more, the effect of the invention is obtained. However, if the light intensity is too strong, a structural change, such as crystallization, may occur, so that the upper limit of the light intensity is in a range that no structural change occurs.

The wavelength and intensity of light are different depending on the semiconductor device or apparatus, so that the values of the wavelength and intensity of light are the same as values when the semiconductor device or apparatus is actually used.

Also, the irradiation time of the predetermined light for irradiation is not particularly limited as long as the irradiation time is in a range that the effect of the present invention (threshold compensation effect) is obtained. However, if the irradiation time is too short, the effect of the present invention is not obtained, and if the irradiation time is too long, the effect is saturated even with irradiation for certain time or more, and the tact time during manufacture is long. Therefore, considering these, optimal time can be appropriately set. According to the knowledge of the inventors, the number of photons of light having an intensity of 1 mW/cm$^2$ and a wavelength of 350 nm is $1.76 \times 10^{15}$ for 1 second. When the intensity doubles, the number of photons doubles. When the wavelength doubles, the number of photons doubles. For example, when the band gap of a semiconductor film is 350 nm or less, and the number of traps is $1.76 \times 10^{15}$/cm$^2$, all traps are filled when the semiconductor film is irradiated with the light for 1 second. The number of traps of the semiconductor film used in the present invention is estimated to be $1 \times 10^{15}$/cm$^2$ or less, therefore, it is considered that when the semiconductor film is irradiated with the light for 1 second or more, the effect of the present invention is obtained. In the present invention, irradiation with light having 0.01 mW/cm$^2$ or more is performed, so that with light having 1 mW/cm$^2$ or less, an irradiation time of 1 second is insufficient. In this case, the time should be adjusted to the intensity and wavelength of light, or the intensity and wavelength of light should be adjusted considering the tact time. For example, the intensity and wavelength of light can be adjusted so that the effect of the present invention can be obtained in the range of 1 second or more and 500 seconds or less.

Figure 4:
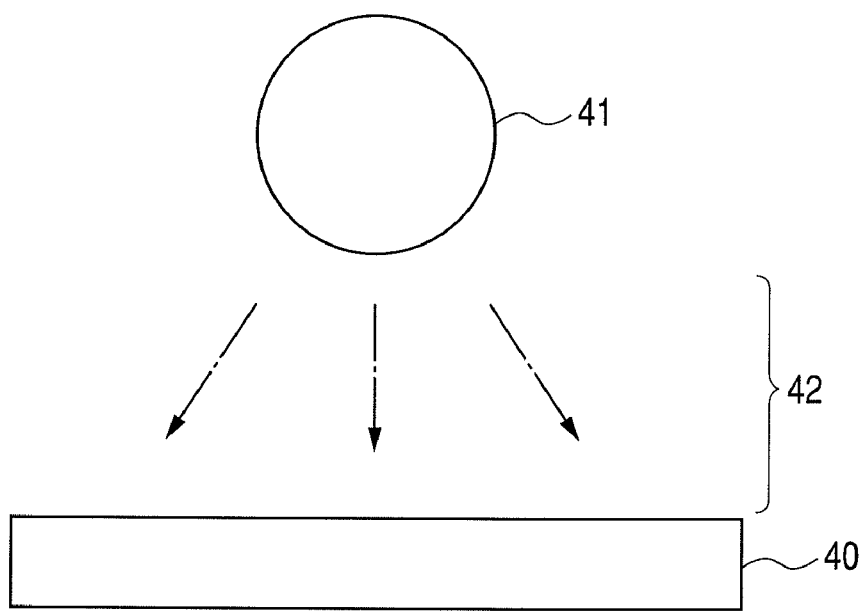
FIG. 4 is a diagram describing light irradiation for a semiconductor device or apparatus.

FIG. 4 illustrates the configuration of irradiation with the predetermined light. A semiconductor device 40 or a semiconductor apparatus 40, and a light source 41 are suitably located. The light source 41 may be of any shape. As the light source, self-light-emitting type light sources, such as a hot filament, discharge, and a light emitting diode, can be applied. Also, environmental light, such as sunlight and room illumination light, can also be applied. Any of the light sources may have units for controlling the wavelength, irradiation intensity, and irradiation time. Also, the configuration is not limited to the opposed location as illustrated in FIG. 4 as long as the desired effect is obtained. Also, light 42 need not be monochromatic light. In other words, the light 42 may be mixed light of a plurality of discrete spectrum lights, or continuous spectrum light.

Figure 5:
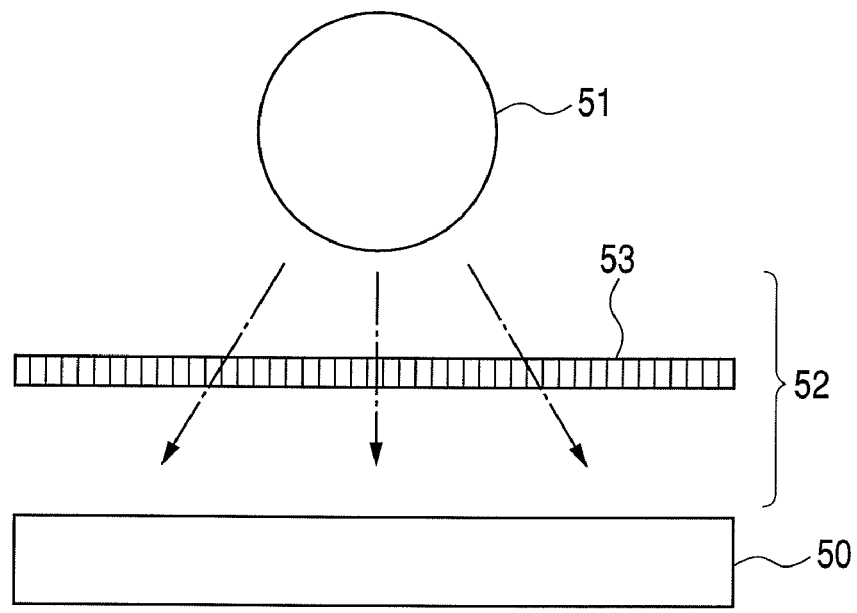
FIG. 5 is a diagram describing another form of light irradiation for a semiconductor device or apparatus.

Desirably, the semiconductor is sufficiently shielded from light having a shorter wavelength than the absorption edge wavelength of the semiconductor. If the semiconductor is irradiated with light having a short wavelength, characteristics other than the threshold voltage also changes largely. Also, as in light having a long wavelength, after irradiation with light having a short wavelength is stopped, the effect of the irradiation remains in the semiconductor. It is considered that changes in various characteristics of the semiconductor during irradiation with light having a shorter wavelength than the absorption edge wavelength are related to large changes in carrier density in the valence band and the conduction band and in the occupation state of the level in the gap caused by the interband transition of carriers due to light. Therefore, desirably, a filter 53 is inserted in the optical path to provide a mechanism for preventing irradiation with light having a shorter wavelength than the wavelength of the absorption edge of the semiconductor, as illustrated in FIG. 5. For the filter, optical filters, such as a high-pass filter that passes only light having a specific long wavelength, a low-pass filter that passes only light having a short wavelength, and a band-pass filter that passes only a specific wavelength, are used.

After <Step (6)> as described above is completed, the manufacturing process proceeds to the following step.

<Step (7)>: When the absolute value of the threshold voltage Vth is in the predetermined range, the TFT is determined as a good product, and when the absolute value of the threshold voltage Vth is not in the predetermined range, the TFT is determined as a defective product.

Here, though the predetermined range of the threshold voltage Vth is different depending on the semiconductor device or apparatus, the predetermined range is a range defined by the following minimum value and maximum value. In other words, the minimum value of the range is the minimum value of voltage applied when the semiconductor device or apparatus is actually operated, and the maximum value of the range is the value of one tenth of maximum voltage applied when the semiconductor device or apparatus is actually operated.

Even if the light irradiation of the present invention is performed in this manner, some variations occur among the semiconductor devices or the semiconductor apparatuses. The causes of variations in performance among the semiconductor devices or the semiconductor apparatuses after light irradiation include a process batch-to-process batch distribution, a device size distribution, a process damage distribution, and the like, due to the formation process. Also, the causes include a composition distribution, an impurity concentration distribution, and the like, due to the raw materials for film formation. It is considered that as a result of these combined causes of variations, there are some variations in level among semiconductor layers due to defects and the like in the semiconductor films, and the semiconductor device and the semiconductor apparatus having a plurality of devices have a size distribution affecting performance, so that variations in performance occur. However, even with such variations, the semiconductor devices and the semiconductor apparatuses function as products without problems if the threshold voltage Vth is in the above range.

<Step (8)>: An organic EL portion 18 is formed on the substrate on which the TFT determined as a good product in the step (7) is formed.

Determination is performed after the fabrication of the TFT portion in FIG. 2, but determination may be performed during the fabrication of the TFT portion, or after the making of the organic EL portion 18.

Also, in the above, the process of manufacturing the inverted staggered type TFT has been described in order, but, of course, the manufacturing process can be applied to the staggered type TFT as long as the manufacturing process has the feature of the present invention. In other words, even if the order of fabrication of members is changed, there are no problems as long as whether the TFT is acceptable or not can be determined after or during irradiation with light having a longer wavelength than the absorption edge wavelength of the semiconductor, which is the feature of the present invention, even if the steps in the process are changed.

Next, one example of a manufacturing apparatus for carrying out the present invention is described.

Figure 8:
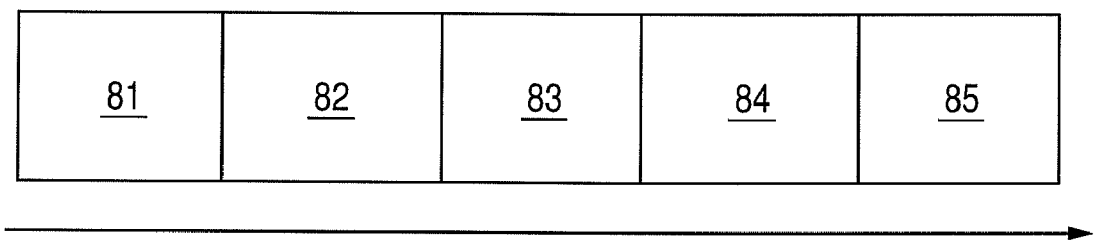
FIG. 8 is a diagram describing one embodiment of the manufacturing apparatus of the present invention.

FIG. 8 illustrates a configuration diagram of a manufacturing line for carrying out the present invention. This manufacturing apparatus includes a carry-in chamber 81, a TFT fabrication chamber 82, a TFT check chamber 83, an organic EL portion fabrication chamber 84, and a carry-out chamber 85. These rooms are connected in series. In the TFT fabrication chamber, an exposure apparatus, a sputtering apparatus, and the like, necessary for the fabrication of the TFT, are included, and film formation and patterning are performed. In the TFT check chamber, a light source, a mechanism for adjusting the wavelength, intensity, and irradiation time of light, an apparatus for evaluating the electrical characteristics of the TFT, and the like, necessary for inspection, are included, and after or during irradiation with predetermined light, the transfer characteristics of the TFT are evaluated to determine whether the TFT is good or not. The adjustment of the wavelength, intensity, and irradiation time of light can be achieved by any illumination system including a suitable wavelength adjustment unit, light intensity adjustment unit, and intermittent light control unit. As the light source, a xenon lamp, an incandescent lamp, a light emitting diode, a fluorescent lamp, and the like can be used. The wavelength adjustment unit can be appropriately selected for use from a diffraction grating spectroscope, a high-pass filter, a low-pass filter, a band-pass filter, and the like, according to the emission spectrum of the light source. As the light intensity adjustment unit, an ND filter, a diffusion plate, and the like can be used, but the emission intensity of the light source itself may be adjusted. As the intermittent light control unit, light irradiation/cut-off by an electromagnetic shutter or the like can be used, but the on/off of the light source itself may be adjusted. In the organic EL fabrication chamber, an exposure apparatus, a vapor deposition apparatus, and the like, necessary for the fabrication of an organic EL, are included, and film formation and patterning are performed.

The manufacturing apparatus for carrying out the present invention is not limited to the manufacturing apparatus having the above configuration, and may have any configuration as long as the feature of the present invention described above can be suitably implemented.

EXAMPLE

An example of the present invention will be described below, but the present invention is not limited to the following example.

Example 1

In this example, an organic EL display device using a-IGZO for a channel layer was fabricated according to the method for manufacturing a semiconductor device and a semiconductor apparatus according to the present invention. In this example, an organic EL device driven at −10 to 30 V was used.

First, the absorption edge wavelength of a-IGZO was estimated.

20 nm of an a-IGZO film was formed on an n$^+$-silicon wafer substrate with a thermally oxidized silicon film (film thickness: 100 nm) by a sputtering method. Here, the input RF power was 200 W. Also, for the atmosphere during film formation, the total pressure was 0.5 Pa, and the gas flow ratio at the time was Ar: $O_2$=95:5. Also, the film formation rate was 8 nm/minute, and the substrate temperature was 25° C.

Next, the phase difference and amplitude ratio of reflected p- and s-polarized light were obtained by ultraviolet-visible spectroscopic ellipsometry. Further, assuming Tauc-Lorentz model absorption and Gaussian model absorption as fundamental (between band edges) absorption and edge (sub-band) absorption respectively, the fitting analysis of the extinction coefficient and refractive index was performed to satisfy the Kramers-Kronig relation. As a result, a value of 3.5 eV (=354 nm) was obtained as the absorption edge of the fundamental absorption, that is, the optical band gap of this film.

Next, the inverted staggered type TFT illustrated in FIG. 1 was fabricated. Here, for the substrate 10, a glass substrate, Corning 1737 was used.

First, Ti having a thickness of 5 nm, Au having a thickness of 50 nm, and Ti having a thickness of 5 nm were laminated in this order on the substrate 10 by an electron beam vapor deposition method. The laminated films were formed into the gate electrode 11 by using a photolithography method and a lift-off method. Further, a $SiO_2$ film having a thickness of 200 nm was formed on the gate electrode 11 by a sputtering method to form the gate insulating layer 12. Then, an a-IGZO film having a thickness of 40 nm was deposited as the channel layer 13 by the above film formation method. Then, the deposited a-IGZO film was patterned by using the photolithography method and an etching method. Ti having a thickness of 5 nm, Au having a thickness of 50 nm, and Ti having a thickness of 5 nm were laminated in this order on the patterned a-IGZO film by the electron beam vapor deposition method, and the source electrode 14 and the drain electrode 15 were formed by the photolithography method and the lift-off method. Further, 200 nm of a $SiO_2$ film was deposited as the first protection layer 16 on the source electrode 14 and the drain electrode 15 by the sputtering method.

In this example, the input RF power was 400 W. For the atmosphere during film formation, the total pressure was 0.1 Pa, and the gas flow ratio at the time was $Ar:O_2=50:50$. Also, the film formation rate was 2 nm/minute, and the substrate temperature was 25° C.

Next, 300 nm of $SiN_x$ was deposited as the second protection layer 17 on the first protection layer 16 by a plasma CVD method. Finally, some portions on the gate electrode 11, the drain electrode 14, and the source electrode 15 were removed by the photolithography method and the etching method to form contact holes.

The TFT was formed by the above method.

Next, first, the electrical characteristics of the above TFT were evaluated in a dark place. Further, the TFT was irradiated with light having a wavelength of 550 nm and an intensity of 0.2 $mW/cm^2$ for 120 seconds, and the characteristics of the TFT were evaluated. Respective results are illustrated in FIG. 6.

For the organic EL device fabricated in this example, the organic EL device driven at −10 to 30 V was used, so that the tolerance of the threshold voltage, which was the standard of determination, was −10 to 3 V.

Figure 6:
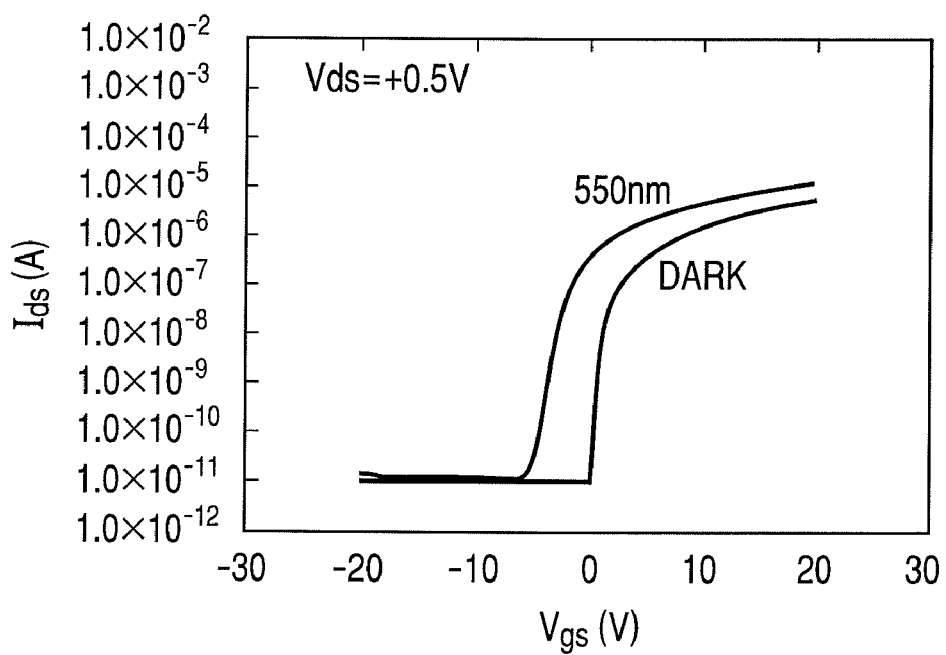
FIG. 6 is a graph describing Example 1.

As illustrated in FIG. 6, the threshold voltage after light irradiation was −4.786 V, so that the above TFT passed determination. Therefore, it was determined that the process was allowed to proceed to the following step, and the organic EL portion 18 was formed. The organic EL portion included a cathode, an electron injection layer, an electron transport layer, a light emitting layer, a hole transport layer, a hole injection layer, and an anode.

In organic EL devices manufactured without an inspection step, defective products, such as products having large variations, are included, but the organic EL display devices manufactured in this example clearly have better yield than organic EL display devices manufactured without an inspection step.

Reference Example

This reference example illustrates a case where after the fabrication of a TFT, the TFT was determined as a defective product in the process of manufacturing an organic EL display device.

Figure 7:
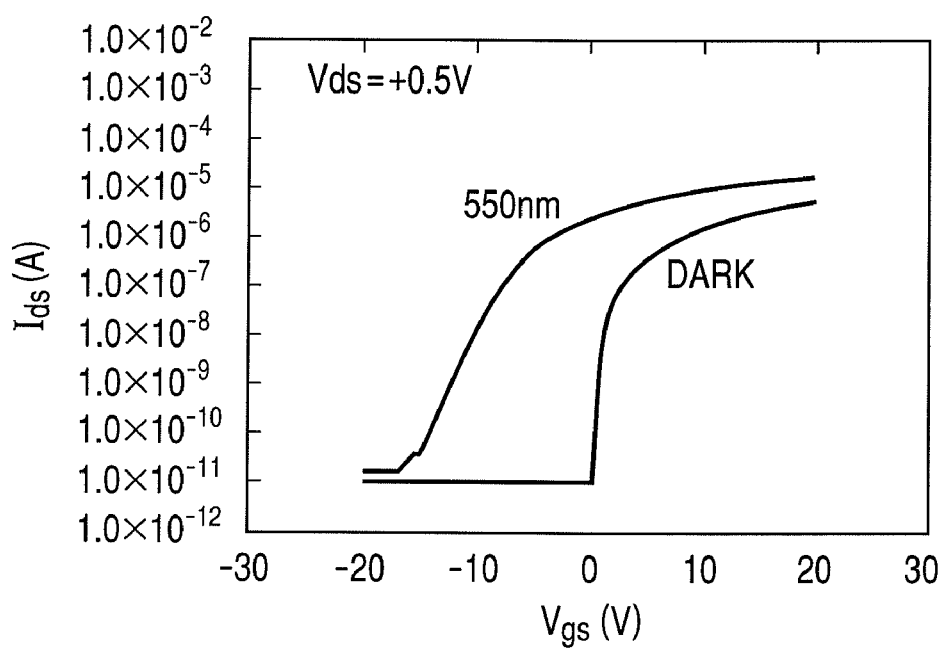
FIG. 7 is a graph describing a reference example.

FIG. 7 illustrates the characteristics of a TFT fabricated as in Example 1 and irradiated with light having a wavelength of 550 nm and an intensity of 0.2 $mW/cm^2$ for 120 seconds as in Example 1.

As illustrated in FIG. 7, the threshold voltage of the TFT of this reference example was −14.436 V and was not in the appropriate range of −10 to 3 V, so that the TFT was handled as a defective product. Also, the values of characteristics other than the threshold voltage also changed largely.

As the reason that this reference example was a defective product, the following is considered. When the surface density of the level in the gap of the semiconductor is $10^{13}$ $cm^{-2}$ $eV^{-1}$ or more in the manufacturing process for some reason, the following problem occurs. Even with irradiation with photons having sufficiently smaller (for example, about a half) energy than the band gap, the process of the excitation of electrons (or holes) from the level in the gap to the conduction band (or the valence band) is not negligible. In other words, even with irradiation with light having a sufficiently longer wavelength than the absorption edge wavelength, the state is similar to the above-described state when irradiation with light having a short wavelength is performed. Therefore, it is considered that in the TFT of this reference example, the surface density of the level in the gap of the semiconductor was high, so that the TFT was a defective product.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-124857, filed May 12, 2008, which is hereby incorporated by reference in its entirety.

The invention claimed is:

1. A method for manufacturing a semiconductor device or apparatus having at least a display element and a TFT for controlling the display element, comprising:
   forming the TFT having a protection layer, the protection layer being formed in an atmosphere containing approximately 10 to 80% of oxygen gas;
   evaluating a threshold voltage of the formed TFT; and
   forming the display element after the evaluating, wherein the evaluating comprises irradiating the TFT with light having a wavelength which is equal to or more than an absorption edge wavelength of a semiconductor of the TFT to change the threshold voltage of the TFT, and checking the changed threshold voltage of the TFT, after the irradiating with the light, to determine whether the changed threshold voltage is in a predetermined range.

2. The method according to claim 1, wherein the TFT is shielded from light having a shorter wavelength than the absorption edge wavelength of the semiconductor.

3. The method according to claim 2, wherein the shielding is performed by a filter located between a light source and the TFT.

4. The method according to claim 1, wherein the semiconductor device or apparatus has at least a gate electrode, a source electrode, a drain electrode, a channel layer, a gate insulating layer, and a protection layer, and the semiconductor is the channel layer.

5. The method according to claim 4, wherein the channel layer is an oxide comprising any of In, Ga, Zn, and Sn.

6. The method according to claim 1, wherein the predetermined range is a range in which a minimum value of the predetermined range is defined by a minimum value of voltage applied when the semiconductor device or apparatus is operated, and a maximum value of the predetermined range is defined by a value of one tenth of a maximum value of the voltage applied when the semiconductor device or apparatus is operated.

7. An apparatus for manufacturing a semiconductor device or apparatus having at least a semiconductor as a component, comprising:
a check chamber for determining the semiconductor device or apparatus by the method according to claim 1, in a manufacturing line for the semiconductor device or apparatus; and
the check chamber comprising at least a light source for irradiating the semiconductor with light having a longer wavelength than an absorption edge wavelength of the semiconductor, and a mechanism for checking a threshold voltage of the semiconductor device or apparatus after or during irradiation with the light.

8. The method according to claim 2, wherein the semiconductor device or apparatus has at least a gate electrode, a source electrode, a drain electrode, a channel layer, a gate insulating layer, and a protection layer, and that the semiconductor is the channel layer.

9. The method according to claim 8, wherein the shielding is performed by a filter located between a light source and the semiconductor.

10. The method according to claim 8, wherein the channel layer is an oxide comprising any of In, Ga, Zn, and Sn.

11. The method according to claim 9, wherein the channel layer is an oxide comprising any of In, Ga, Zn, and Sn.

12. The method according to claim 2, wherein the predetermined range is a range in which a minimum value of the predetermined range is defined by a minimum value of voltage applied when the semiconductor device or apparatus is operated, and a maximum value of the predetermined range is defined by a value of one tenth of a maximum value of the voltage applied when the semiconductor device or apparatus is operated.

13. The method according to claim 12, the shielding is performed by a filter located between a light source and the semiconductor.

14. The method according to claim 4, wherein the semiconductor device or apparatus has at least a gate electrode, a source electrode, a drain electrode, a channel layer, a gate insulating layer, and a protection layer, and that the semiconductor is the channel layer.

15. The method according to claim 14, wherein the channel layer is an oxide comprising any of In, Ga, Zn, and Sn.

16. The apparatus according to claim 7, wherein the semiconductor is shielded from light having a shorter wavelength than the absorption edge wavelength of the semiconductor.

17. The apparatus according to claim 16, wherein the shielding is performed by a filter located between a light source and the semiconductor.

18. The apparatus according to claim 7, wherein the semiconductor device or apparatus has at least a gate electrode, a source electrode, a drain electrode, a channel layer, a gate insulating layer, and a protection layer, and that the semiconductor is the channel layer.

19. The apparatus according to claim 18, wherein the channel layer is an oxide comprising any of In, Ga, Zn, and Sn.

20. The apparatus according to claim 19, wherein the predetermined range is a range in which a minimum value of the predetermined range is defined by a minimum value of voltage applied when the semiconductor device or apparatus is operated, and a maximum value of the predetermined range is defined by a value of one tenth of a maximum value of the voltage applied when the semiconductor device or apparatus is operated.

21. An organic EL display comprising:
an organic EL element; and
a TFT, having a-IGZO film as a channel layer, for controlling the organic EL element, and having a protection layer, the protection layer being formed in an atmosphere containing approximately 10 to 80% of oxygen gas,
wherein a threshold voltage of the TFT is in a predetermined range after the TFT has been irradiated with light having a wavelength of 550 nm and an intensity of 0.2 mW/cm2 for 120 seconds.

22. The organic EL display according to claim 21, wherein the predetermined range is a range in which a minimum value of the predetermined range is defined by a minimum value of voltage applied when the TFT is operated, and a maximum value of the predetermined range is defined by a value of one tenth of a maximum value of the voltage applied when the TFT is operated.

* * * * *